United States Patent
Nene et al.

(10) Patent No.: US 10,886,900 B2
(45) Date of Patent: Jan. 5, 2021

(54) MULTI-PHASE MULTI-FREQUENCY PULSE WIDTH MODULATION

(71) Applicant: Texas Instruments Incorporated, Dallas, TX (US)

(72) Inventors: Hrishikesh Ratnakar Nene, Katy, TX (US); Subrahmanya Bharathi Akondy, Cypress, TX (US); Kristopher Sean Parrent, Richmond, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/700,692

(22) Filed: Dec. 2, 2019

(65) Prior Publication Data

US 2020/0350894 A1 Nov. 5, 2020

Related U.S. Application Data

(63) Continuation of application No. 16/399,394, filed on Apr. 30, 2019, now Pat. No. 10,530,344.

(51) Int. Cl.
*H03K 3/017* (2006.01)
(52) U.S. Cl.
CPC .................. *H03K 3/017* (2013.01)
(58) Field of Classification Search
None
See application file for complete search history.

(56) References Cited

U.S. PATENT DOCUMENTS

| | | | |
|---|---|---|---|
| 9,172,394 B2 | 10/2015 | Lindahl et al. | |
| 9,379,723 B2 * | 6/2016 | Lia | H03L 7/1974 |
| 10,530,344 B1 * | 1/2020 | Nene | H03K 7/08 |
| 2007/0262802 A1 | 11/2007 | Huard et al. | |
| 2009/0315529 A1 | 12/2009 | Chung | |
| 2010/0052760 A1 | 3/2010 | Fujiwara | |
| 2013/0127430 A1 | 5/2013 | Leung | |
| 2016/0314092 A1 * | 10/2016 | Suzuki | G06F 1/3237 |
| 2017/0126119 A1 | 5/2017 | Bernardon | |
| 2017/0358956 A1 * | 12/2017 | Martin | H02M 7/04 |
| 2018/0323695 A1 | 11/2018 | Link et al. | |
| 2019/0089286 A1 | 3/2019 | Toba et al. | |
| 2019/0103862 A1 | 4/2019 | Ido | |
| 2019/0312501 A1 * | 10/2019 | Yamada | H03K 17/0822 |

* cited by examiner

*Primary Examiner* — Lincoln D Donovan
*Assistant Examiner* — Khareem E Almo
(74) *Attorney, Agent, or Firm* — Michelle F. Murray; Charles A. Brill; Frank D. Cimino

(57) ABSTRACT

In described examples, a method of generating a pulse width modulation (PWM) signal includes repeatedly master control counting, by a master control counter generator, which includes one or both of incrementing and decrementing a master control counter with a minimum value and a maximum value, and repeatedly slave control counting with a phase delay with respect to the master control counting, and during a transition period, slave control counting to a new maximum value or a new phase delay. A maximum count of the transition period is selected to result in the transition period reaching the minimum value at the new phase delay count. The PWM signal is generated by generating rising edges when the slave control counter reaches a rising edge threshold, and generating falling edges when the slave control counter reaches a falling edge threshold.

20 Claims, 7 Drawing Sheets

MULTI-PHASE MULTI-FREQUENCY PULSE WIDTH MODULATION

CROSS-REFERENCE TO RELATED APPLICATIONS

This application is a continuation application of U.S. patent application Ser. No. 16/399,394 filed on Apr. 30, 2019, which is incorporated herein by reference in its entirety.

BACKGROUND

This application relates generally to electronic circuitry, and more particularly to pulse width modulation methodology and circuitry.

FIG. 1A shows an example of a count plot 100, having an amplitude proportional to count, and representative of a pulse width modulation (PWM) control counter 102 against time, and an example of a timing diagram 104 of a PWM waveform 106 generated using the control counter 102. (Herein, "control count" refers to both a count generator, and a resulting count. The count of the control counter is referred to when appropriate for clarification.) The count plot 100 and the timing diagram 104 use the same time axis. Accordingly, a count value in the control counter 102 expressed at a particular point on the x-axis (time axis) in the count plot 100 and a PWM value (high or low) in the PWM waveform 106 expressed at the same point on the x-axis (time axis) in the timing diagram 104 are being expressed at the same time. This time axis alignment applies to each of the figures herein which include a plot of a PWM control counter and a timing diagram of a PWM waveform generated using the control counter.

The example PWM control counter 102 and PWM waveform 106 shown in FIG. 1A correspond to typical PWM control. The control counter 102 counts from a minimum value, generally zero, up to a maximum value (incrementing), and then restarts the count from the minimum value. This results in a sawtooth pattern. The control counter 102 is compared against two thresholds, a rising edge threshold 108 and a falling edge threshold 110, to cause rising and falling edges (respectively) in the PWM waveform 106. The rising edge threshold 108 corresponds to the maximum count of the control counter 102, which corresponds to a desired frequency of the PWM waveform 106. The falling edge threshold 110 corresponds to one half (½) of the maximum count of the control counter 102, corresponding to a 50% duty cycle in the PWM waveform 106. The falling edge threshold 110 fraction of the maximum count can be adjusted to adjust the duty cycle of the PWM waveform 106.

A first desired frequency $F_1$, designated for a time $T_0$ to a time $T_1$, corresponds to a maximum count of C=1000 counts. A second desired frequency $F_2$, designated for a time $T_1$ to a time $T_2$, corresponds to a maximum count of C=400 counts. A third desired frequency $F_3$, designated for a time $T_2$ to a time $T_3$, corresponds to a maximum count of C=1000 ($F_1$=$F_3$). The rising edge threshold 108 of $F_1$ and $F_3$ is 1000 counts, and the falling edge threshold 110 of $F_1$ and $F_3$ is 500 counts. The rising edge threshold 108 of $F_2$ is 400, and the falling edge threshold 110 of $F_2$ is 200. Times $T_0$, $T_1$, $T_2$, and $T_3$ are the same times in FIGS. 1A, 1B and 1C.

The minimum count of the control counter 102 is C=0 counts. If the minimum count were higher, such as C=50 counts, then the respective frequencies would be higher because of the smaller differences between maximum and minimum counts. The frequencies would be the same if the minimum counter were higher, such as C=50 counts, and the maximum counts were equally increased, accordingly, to $F_1$=$F_3$=1050 counts, and $F_2$=450 counts. That is, the frequency (and period) of the control counter 102 depends on the difference between the maximum and minimum counts of a period of the control counter 102.

FIG. 1B shows a prior art example of a count plot 112 of a PWM control counter 114 against time, and an example of a timing diagram 116 of a PWM waveform 118 generated using the control counter 114. The count plot 112 and the timing diagram 116 use the same time axis. The control counter 102 of FIG. 1A acts as a master control counter with respect to the control counter 114 of FIG. 1B. This means that the control counter 114 values for the count (except during a period which spans or is next subsequent to a change in frequency or phase delay), frequencies (maximum and minimum count values), and thresholds of FIG. 1B are the same as the control counter 102 values for the count, frequencies, and thresholds of FIG. 1A; except that the (slave) control counter 114 of FIG. 1B is phase shifted +180° with respect to the (master) control counter 102 of FIG. 1A.

As used herein, "phase shift" refers to an angle of rotation (a fractional shift) of a period of a slave control counter with respect to a period of a master control counter. As used herein, "phase delay count" refers to a count value by which, for a corresponding phase shift applied to and a current frequency of the slave control counter, the period of the slave control counter is shifted with respect to the period of the master control counter. The phase delay count corresponds to a number of increments of the master control counter, after the master control counter reaches a particular value while incrementing or decrementing, before the slave control counter reaches the particular value while incrementing or decrementing, respectively. In FIG. 1B, between times $T_0$ and $T_1$, and between times $T_2$ and $T_3$, the phase delay count of the control counter 114 with respect to the master control counter 102 is 50% of 1000, that is, 0.5*1000=500 counts (+180° corresponds to a delay of 50% of a single period). Between times $T_1$ and $T_2$, the phase delay count of the control counter 114 with respect to the master control counter 102 is 400*0.5=200 counts.

When the control counter 114 transitions from $F_1$ to $F_2$ at time $T_1$, the count of the control counter 114 is phase shifted +180° with respect to the count at time $T_1$ of the control counter 102 of FIG. 1A. To maintain the +180° phase shift and the new frequency, the count at time $T_1$ changes from a count corresponding to the previous frequency (C=499 counts) to a count corresponding to the new frequency (C=200 counts). (A similar change from C=199 to C=500 counts occurs at the control counter 114 transition from $F_2$ to $F_3$ at time $T_2$.) As a result, the continuing incrementing of the control counter 114 is interrupted and, consequently, the falling edge threshold 120 is not reached at time $T_1$ on transition from $F_1$ to $F_2$, because the control counter 114 count jumps to (does not properly increment to) 200 at time $T_1$, and thresholds do not change until the end of a period. Accordingly, in FIG. 1B and at time $T_1$, when the control counter 114 would increment to and reach the falling edge threshold 120 if there were no frequency change, the control counter 114 jumps to—does not increment to—the falling edge threshold 120. Therefore, no falling edge is triggered in the PWM waveform 118 at time $T_1$, as shown by the dotted vertical line beginning a missed cycle 128 in FIG. 1B at time $T_1$. Similarly, at time $T_2$, when the incrementing control counter 114 would reach a falling edge threshold 120 if there were no frequency change, the control counter 114 does not increment to the falling edge threshold 120, and no falling edge is triggered in the PWM waveform 118 at time T₂, as shown by another dotted vertical line beginning a missed cycle 128 in FIG. 1B at time T₂. (There is also a rising edge threshold 122.)

Changes in frequency in a PWM control counter can cause discontinuities 124 in the count maintained by the PWM control counter. Such discontinuities 124 can, in turn, cause errors in a PWM waveform controlled by the PWM control counter. In FIG. 1B, dotted lines in the PWM waveform 118 show intended portions 128 of the PWM waveform 118, and deviations from this intention—shown using dashed lines—include erroneous portions 126 of the PWM waveform 118. PWM waveform 118 errors can cause extended periods in the PWM waveform 118 at frequency transitions. Extended PWM waveform 118 periods can result in adverse effects in circuits incorporating PWM control. For example, interruption in alternation of a PWM waveform 118 in a circuit using PWM to control power delivery to a primary side of a transformer (or other inductor) can result in overvoltage of a capacitor, or oversaturation of an inductor, potentially damaging a corresponding circuit.

FIG. 1C shows a prior art example of a count plot 130 of a PWM control counter 132 against time, and an example of a timing diagram 134 of a PWM waveform 136 generated using the control counter 132. The count plot 130 and the timing diagram 134 use the same time axis. The control counter 102 of FIG. 1A acts as a master control counter with respect to the control counter 132 of FIG. 1C. This means that the (slave) control counter 132 count (except during a period which spans or is next subsequent to a change in frequency or phase delay), values for the frequencies (maximum and minimum count values), and thresholds of FIG. 1C are the same as the (master) control counter 102 values for the frequencies and thresholds of FIG. 1A; except that the control counter 132 of FIG. 1C is phase shifted +90° with respect to the control counter 102 of FIG. 1A. This phase shift does not cause errors in the PWM waveform 136 because discontinuities 124 in the PWM waveform 136 do not occur at a rising edge threshold 138 or a falling edge threshold 140, and the thresholds 138, 140 are held constant. However, in typical embodiments, rising edge and/or falling edge thresholds are variable.

SUMMARY

In described examples, a method of generating a pulse width modulation (PWM) signal includes repeatedly master control counting, by a master control counter generator, which includes one or both of incrementing and decrementing a master control counter with a minimum value and a maximum value, and repeatedly slave control counting with a phase delay with respect to the master control counting, and during a transition period, slave control counting to a new maximum value or a new phase delay. A maximum count of the transition period is selected to result in the transition period reaching the minimum value at the new phase delay count. The PWM signal is generated by generating rising edges when the slave control counter reaches a rising edge threshold, and generating falling edges when the slave control counter reaches a falling edge threshold.

DETAILED DESCRIPTION

Figure 2A:
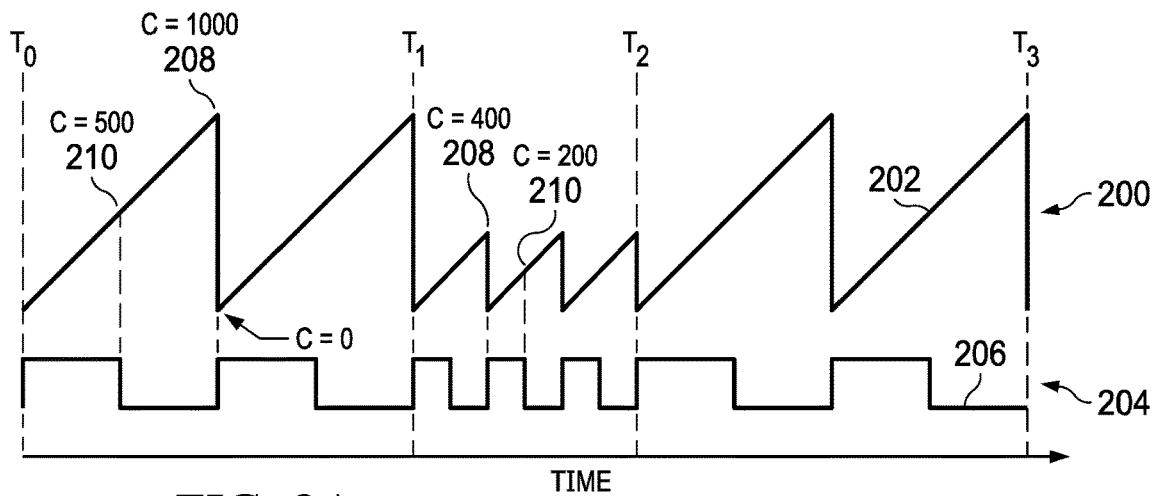
FIG. 2A shows an example of a count plot of a PWM control counter embodiment (with variable period) against time, and an example of a timing diagram of a PWM waveform generated using the control counter.

FIG. 2A shows an example of a count plot 200 of a pulse width modulation (PWM) control counter 202 embodiment against time, and an example of a timing diagram 204 of a PWM waveform 206 generated using the control counter 202. The plot 200 and the timing diagram 204 use the same time axis. As shown in FIG. 2A, the control counter 202 is compared against two thresholds, a rising edge threshold 208 and a falling edge threshold 210, to cause rising and falling edges (respectively) in the PWM waveform 206. The rising edge threshold 208 corresponds to a maximum count of the control counter 202 which corresponds to a desired frequency of the PWM waveform 206. The falling edge threshold 210 shown in FIG. 2A corresponds to one half (½) of the maximum count of the control counter 202 for a 50% duty cycle; other duty cycles can also be used. The falling edge threshold 210 fraction of the maximum count can be adjusted to adjust the duty cycle of the PWM waveform 206. When the rising edge threshold 208 equals the maximum count of the control counter 202, a 25% duty cycle, for example, would correspond to a falling edge threshold 210 of one quarter (¼) of the maximum count. A first desired frequency $F_1$, designated for a time $T_0$ to a time $T_1$, corresponds to a maximum count of C=1000 counts; a second desired frequency $F_2$, designated for a time $T_1$ to a time $T_2$, corresponds to a maximum count of C=400 counts; and a third desired frequency $F_3$, designated for a time $T_2$ to a time $T_3$, corresponds to a maximum count of C=1000 (that is, for this example, $F_1=F_3$) counts.

Figure 1A:
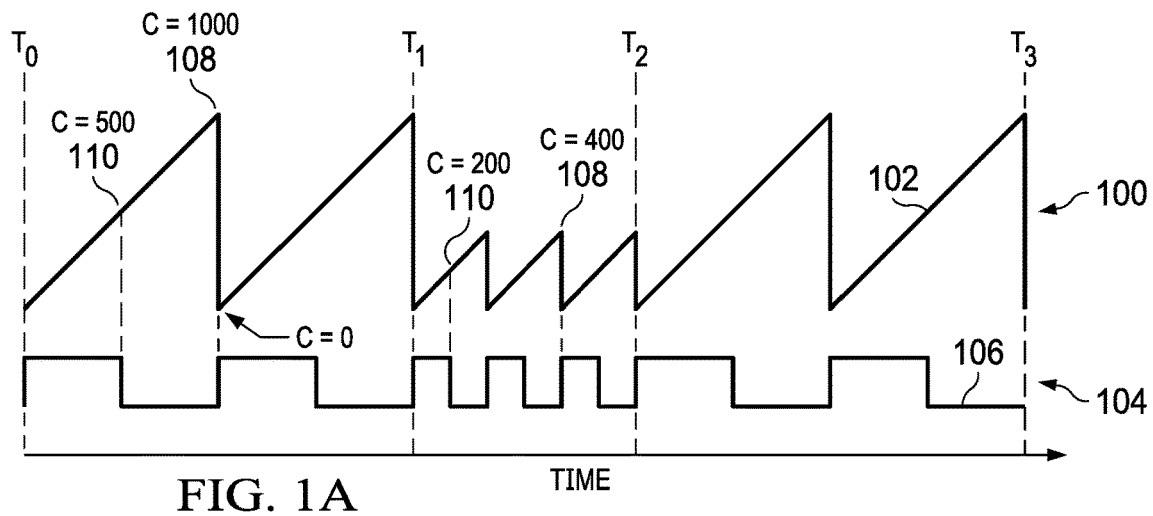
FIG. 1A shows an example of a count plot, having an amplitude proportional to count, and representative of a pulse width modulation (PWM) control counter (with variable period) against time, and an example of a timing diagram of a PWM waveform generated using the control counter.
Figure 1B:
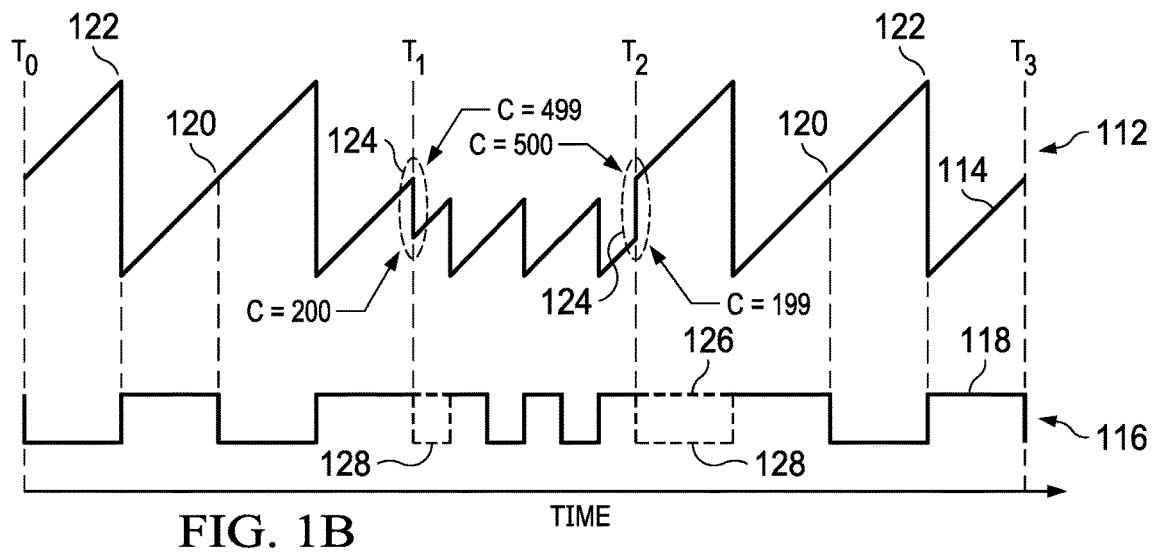
FIG. 1B shows a prior art example of a count plot of a PWM control counter (with variable period and a fixed +180° phase shift with respect to the PWM control counter of FIG. 1A) against time, and an example of a timing diagram of a PWM waveform generated using the control counter.
Figure 1C:
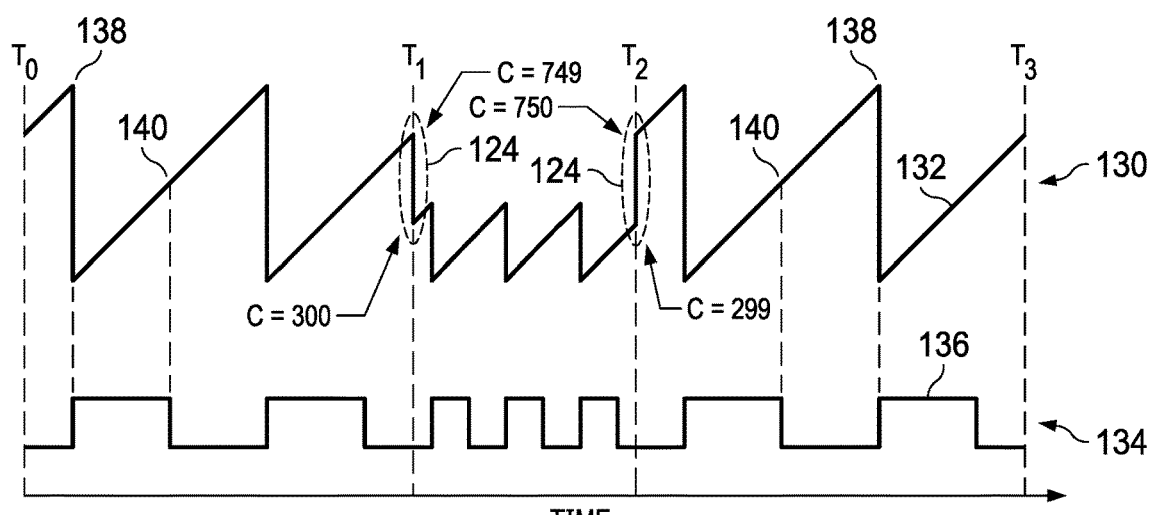
FIG. 1C shows a prior art example of a count plot of a PWM control counter (with variable period and a fixed +90° phase shift with respect to the PWM control counter of FIG. 1A) against time, and an example of a timing diagram of a PWM waveform generated using the control counter.
Figure 2B:
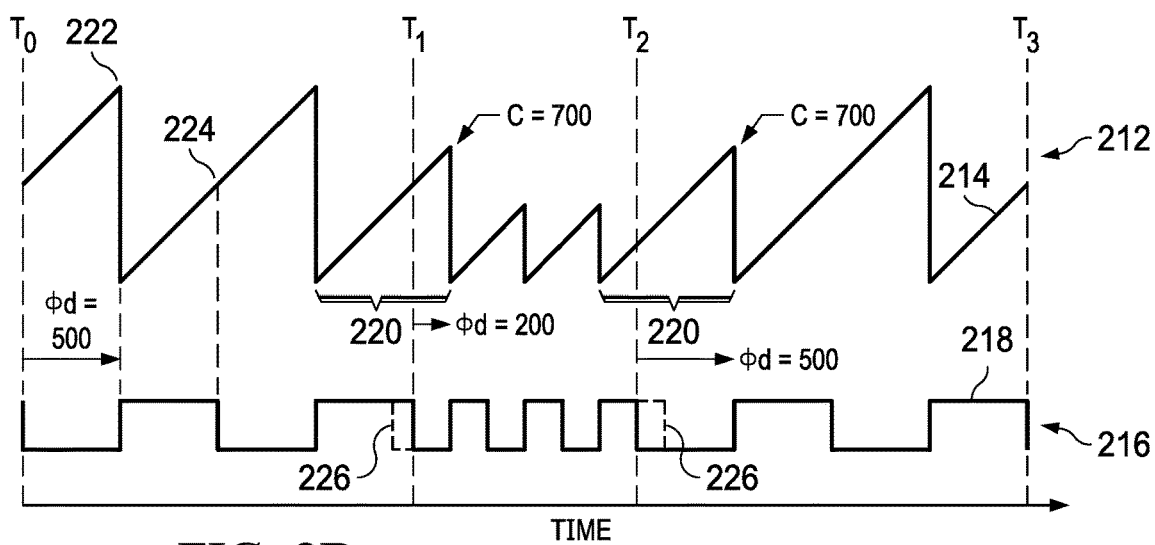
FIG. 2B shows an example of a count plot of a PWM control counter (with variable period and a fixed +180° phase shift with respect to the PWM control counter of FIG. 2A) against time, and an example of a timing diagram of a PWM waveform generated using the control counter.

FIG. 2B shows an example of a count plot 212 of a PWM control counter 214 against time, and an example of a timing diagram 216 of a PWM waveform 218 generated using the control counter 214. The count plot 212 and the timing diagram 216 use the same time axis. The control counter 202 of FIG. 2A acts as a master control counter with respect to the (slave) control counter 214 of FIG. 2B. This means that the (slave) control counter 214 values for the count (except during a period which spans or is next subsequent to a change in frequency or phase delay) and frequencies (maximum and minimum count values) of FIG. 2B are the same as (mirror) the (master) control counter 202 values for the count and frequencies of FIG. 2A; except that the control counter 214 of FIG. 2B is phase shifted +180° (50%) with respect to the control counter 202 of FIG. 2A. (Thresholds of the control counter 214 are also the same as the thresholds of the control counter 202, but this is specific to the examples shown FIGS. 1A-2C and 5A-7C herein. In some embodiments, thresholds of a master control counter can be different from thresholds of a slave control counter.) This means that when the control counter 214 transitions from $F_1$ to $F_2$ at time $T_1$, the count of the control counter 214 is phase shifted +180° (50%) with respect to the count at time $T_1$ of the control counter 202 of FIG. 2A. (Phase shift and phase delay count were described above with respect to FIG. 1B.) In FIG. 2B and other slave plot figures, particular phase delay counts are shown using arrows from time instances where the master control counter transitions (such as $T_0$, $T_1$, $T_2$) to respective ends of corresponding slave control counter cycles, the arrows further designated "Φd" for "phase delay count".

The time when a phase or frequency of the master control counter 202 changes (transitions to a new phase or frequency) can be referred to as a "transition time." The transition time corresponds to a count of the master control counter 202.

At frequency changes (transitions) from a current frequency to a next frequency at the master control counter 202 (at times $T_1$ and $T_2$), the slave control counter 214 of FIG. 2B avoids the discontinuities 124 of FIGS. 1B and 1C in the count of the control counter 214 by extending the duration of the slave cycle (of the control counter 214) affected by (immediately preceding) the transition. This causes the slave cycle to transition to the next frequency at a time later than the transition of the respective (master) PWM control counter 202. For example, in comparing FIGS. 2A and 2B, note that at $T_1$, the master cycle in FIG. 2A transitions from a current frequency to a next frequency, whereas the respective slave cycle is extended and thereby maintains the current frequency beyond $T_1$, before the slave control counter 214 transitions to the next frequency. The entirety of the extended slave cycle at the current frequency is referred to herein as a transitional cycle 220, and is readily notable in FIG. 2B (and later Figures) as spanning before and after the time at which the master control counter 202 transitions frequencies. Preferably, the extended portion of the slave cycle is such that the transitional cycle 220 ends at a time where the count of the next frequency is at a minimum to conform to the change in phase delay count resulting from the change in frequency. The new phase delay count, measured from time $T_1$ to the next time when the control counter 214 reaches a minimum count, as shown in FIG. 2B as a delay Φd beyond $T_1$. Consequently, transitional cycles 220 result in subsequent cycles having a correct phase delay count for the new frequency and/or phase shift, avoid count discontinuities at frequency and/or phase shift changes, and help enable rising edge thresholds 222 and falling edge thresholds 224 to be met, avoiding overlong PWM waveform 218 periods. These results can be further improved by adjusting the falling edge threshold 224 for the transitional cycle 220 to maintain the duty cycle (as further described below).

The above-described extension of a transitional cycle also may be characterized mathematically, where the total period (maximum count), $T_{cn}$, of a transitional cycle 220 from the current frequency to the next frequency, is determined as follows:

$$T_{cn} = T_c - (\Phi d_c - \Phi d_n) \qquad \text{Equation 1}$$

In Equation 1, $T_{cn}$ is the period, in counts, of the transitional cycle 220, $T_c$ is the period, in counts, of the current cycle (the cycle immediately preceding the frequency and/or phase shift change), $\Phi d_c$ is the phase delay count of the current cycle, and $\Phi d_n$ is the phase delay count of the next frequency or phase shift to which the count is transitioning. (The period of the sawtooth pattern control counter 214 is equal to the maximum value of the sawtooth pattern control counter 214 minus the minimum value of the sawtooth pattern control counter 214. The minimum value in FIG. 2B is zero.) $T_{cn}$ can also be called a "transitional maximum value."

By way of example, the phase delay count of the PWM waveform 218 of FIG. 2B with respect to the PWM waveform 206 of FIG. 2A between $T_0$ and $T_1$ and between $T_2$ and $T_3$ (when the control counter 214 has frequency $F_1=F_3$) is C=500 (0.5×1000) counts. The phase delay count of the PWM waveform 218 of FIG. 2B with respect to the PWM waveform 206 of FIG. 2A between $T_1$ and $T_2$ (when the control counter 214 has frequency $F_2$) is C=200 (0.5×400) counts. Therefore, the duration $T_{cn}$ of a transitional cycle 220 for switching from $F_1$ to $F_2$ at time $T_1$ is 1000−(500−200)=700 counts; and the duration $T_{cn}$ of a transitional cycle 220 for switching from $F_2$ to $F_3$ at time $T_2$ is 400−(200−500)=700 counts. As shown in FIG. 2B, the resulting transitional cycles 220 avoid discontinuities 124 by aligning the end of a transitional cycle with a minimum count in the next frequency and therefore properly trigger the rising edge threshold 222 and the falling edge threshold 224.

Transitional cycles generated for sawtooth pattern control counters using Equation 1, and transitional cycles generated for triangle pattern control counters using Equation 2 (described below with respect to FIG. 6B), enable discontinuities to be avoided using minimal computational overhead. Equations 1 and 2 can be implemented using software, hardware, or a combination thereof.

Transitional cycle counts may not always ascend to meet rising and falling edge thresholds. For example, in FIG. 5C (further described below), the transitional cycle 534 spanning $T_2$ is too brief to trigger either threshold 536, 538. In some embodiments, the falling edge threshold can be adjusted for transitional cycles to maintain an assigned duty cycle of the PWM waveform and ensure that transitional cycles meet rising edge thresholds and falling edge thresholds. For example, for a 50% duty cycle, for transitional cycles 220 of duration C=700 counts as shown in FIG. 2B, the falling edge threshold 224 can be adjusted to C=350 (0.5×700) counts. The adjusted portion 226 of the PWM waveform 218 is shown using dotted lines.

Figure 2C:
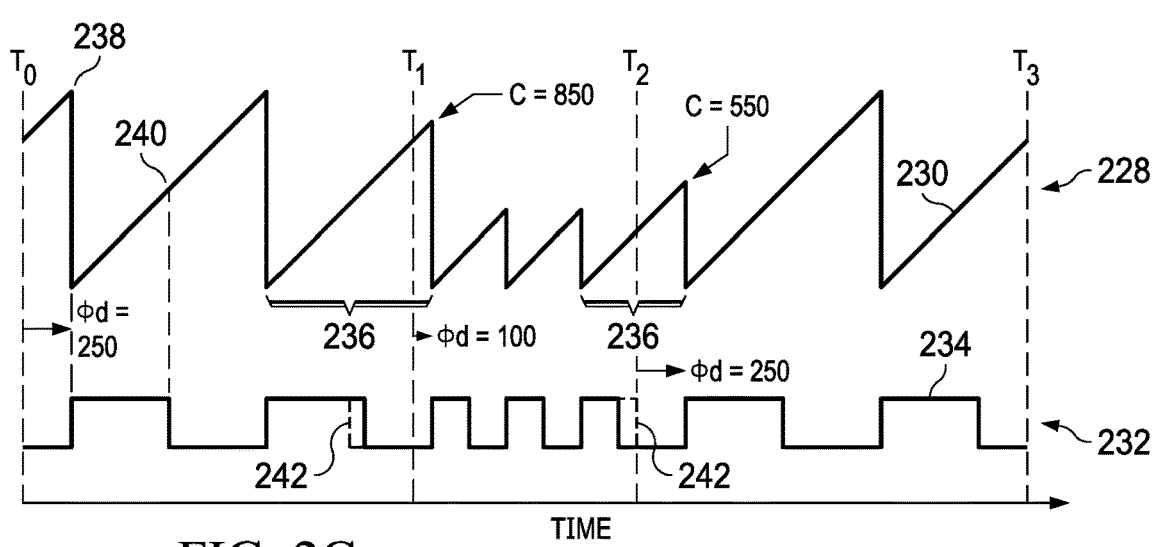
FIG. 2C shows an example of a count plot of a PWM control counter (with variable period and a fixed +90° phase shift with respect to the PWM control counter of FIG. 2A) against time, and an example of a timing diagram of a PWM waveform generated using the control counter.

FIG. 2C shows an example of a count plot 228 of a PWM control counter 230 against time, and an example of a timing diagram 232 of a PWM waveform 234 generated using the PWM control counter 230. The count plot 228 and the timing diagram 232 use the same time axis. The control counter 202 of FIG. 2A acts as a master control counter with respect to the PWM control counter 230 of FIG. 2C (see description of master and slave control counters with respect to FIG. 2B). The PWM control counter 230 of FIG. 2C is phase shifted +90° (25%) with respect to the control counter 202 of FIG. 2A. (For example, the count of the PWM control counter 230 of FIG. 2C is the same as the count of the control counter 202 of FIG. 2A, except during a transition period which spans or is next subsequent to a change in frequency or phase delay.) This means that when the PWM control counter 230 transitions from $F_1$ to $F_2$ at time $T_1$, the count of the PWM control counter 230 is phase shifted +90° (25%; the new phase delay of 100 equals 0.25*400) with respect to the count at time $T_1$ of the control counter 202 of FIG. 2A. At frequency changes of the master ($T_1$ and $T_2$), the (slave) PWM control counter 230 of FIG. 2B avoids discontinuities 124 in the count of the (slave) PWM control counter 230 by extending the current cycle of the PWM control counter 230 to generate a transitional cycle 236.

Periods of transitional cycles 236 are determined as shown above in Equation 1. The phase delay count of the PWM waveform 234 of FIG. 2C with respect to the PWM waveform 206 of FIG. 2A between $T_0$ and $T_1$ and between $T_2$ and $T_3$ (when the control counter 230 has frequency $F_1=F_3$) is C=250 (0.25×1000) counts. The phase delay count of the PWM waveform 234 of FIG. 2C with respect to the PWM waveform 206 of FIG. 2A between $T_1$ and $T_2$ (when the control counter 230 has frequency $F_2$) is C=100 (0.25× 400) counts. Therefore, the duration $T_{cn}$ of a transitional cycle 236 for switching from $F_1$ to $F_2$ at time $T_1$ is 1000−(250−100)=850 counts; and the duration $T_{cn}$ of a transitional cycle 236 for switching from $F_2$ to $F_3$ at time $T_2$ is 400−(100−250)=550 counts. As shown in FIG. 2C, the resulting transitional cycles 236 avoid discontinuities 124 and properly trigger the rising edge threshold 238 and the falling edge threshold 240. Also, to maintain a 50% duty cycle of the PWM waveform 234, for transitional cycles 236 of duration C=850 counts as shown in FIG. 2C, the falling edge threshold 240 for the transitional cycle 236 spanning $T_1$ can be adjusted to C=425 (0.5×850) counts; and the falling edge threshold 240 for the transitional cycle 236 spanning $T_2$ can be adjusted to C=275 (0.5×550) counts. The adjusted portion 242 of the PWM waveform 234 is shown as dotted lines. (The adjusted thresholds for the transitional cycles 236 are not shown with respect to the PWM control counter 230 in FIG. 2C.)

Figure 3:
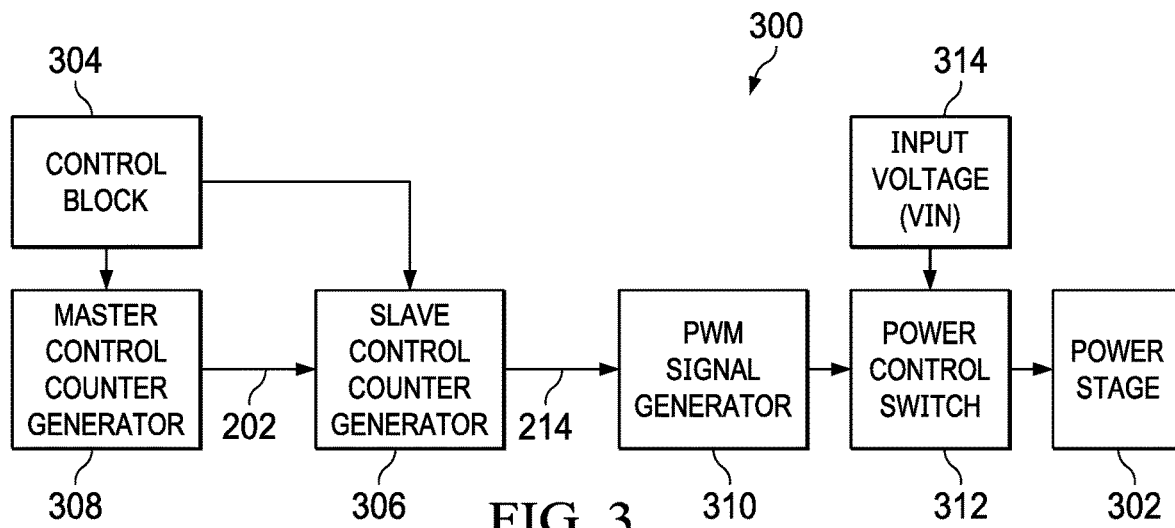
FIG. 3 shows an example of a block diagram of a device for generating a PWM waveform as described with respect to FIG. 2B, and using the PWM waveform to control provision of power to a power stage.

FIG. 3 shows an example of a block diagram 300 of a device for generating a PWM waveform 218 as described with respect to FIG. 2B, and using the PWM waveform 218 to control provision of power to a power stage 302 (such as a primary side of a transformer or other inductor). A control block 304 outputs a control signal to a master control counter generator 308 and to a slave control counter generator 306. The control signal controls a period count of a master control counter 202 generated by the master control counter generator 308 and of a (slave) control counter 214 generated by the slave control counter generator 306. The control signal also controls a phase shift of the control counter 214 with respect to the master control counter 202. The control block can be, for example, a processor or specialized hardware. The master control counter generator 308 outputs the master control counter 202 to the slave control counter generator 306. The slave control counter generator 306 generates the control counter 214 using the master control counter 202 and the control signal, and outputs the control counter 214 to a PWM signal generator 310. The PWM signal generator 310 generates the PWM waveform 218 by creating a signal with rising edges when the control counter 214 meets rising edge thresholds 222, and falling edges when the control counter 214 meets falling edge thresholds 224. The PWM signal generator 310 outputs the PWM waveform 218 to a power control switch 312. The power control switch 312 closes and opens when it receives rising edges and falling edges (respectively, or vice versa) of the PWM waveform 218. The power control switch 312 is connected to an input voltage node (Vin) 314 and to the power stage 302, so that when the power control switch 312 is closed, power will be delivered from the input voltage node 314 to the power stage 302.

Figure 4:
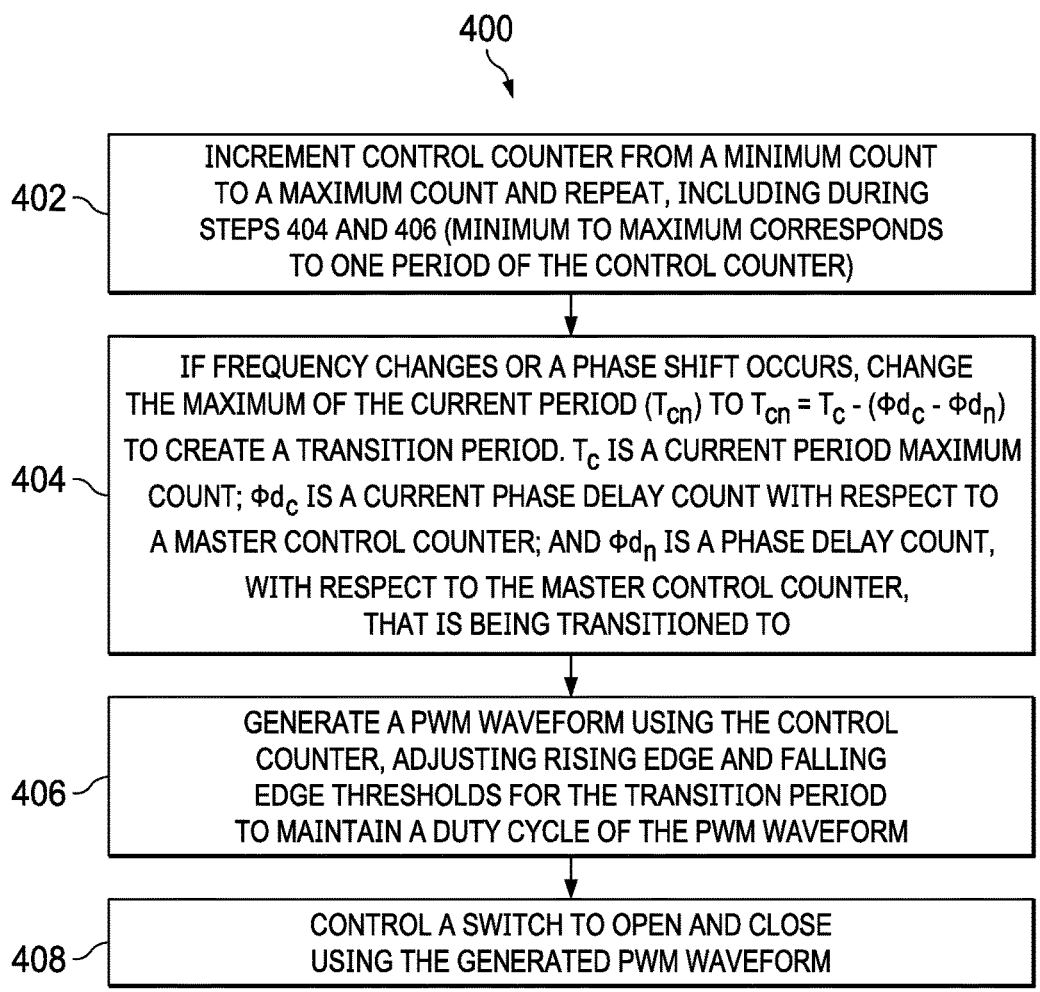
FIG. 4 shows an example process for generating a PWM waveform as described with respect to FIG. 2B, and using the PWM waveform to control a switch.

FIG. 4 shows an example process 400 for generating a PWM waveform 214 as described with respect to FIG. 2B, and using the PWM waveform 214 to control a device (such as a switch). In step 402, the control counter 214 is incremented from a minimum count to a maximum count. The difference between the minimum and maximum counts corresponds to a single period of the count by the control counter 214. The incrementing of the master control counter 214 is repeated, including during steps 404 and 406. In step 404, if a frequency or phase shift of the count by the control counter 214 occurs, the maximum count of the current period for the slave is changed to $T_{cn}=T_c-(\Phi d_c-\Phi d_n)$ (see Equation 1), where the current period ($T_c$) equals the maximum count minus the minimum count. This results in a transition period 220. In step 406, a PWM waveform 218 is generated using the control counter 214 by generating rising and falling edges according to a rising edge threshold 222 and a falling edge threshold 224. Also, the rising edge and falling edge thresholds 222, 224 for the transition period 220 are adjusted to maintain a duty cycle of the PWM waveform 218. In step 408, the generated PWM waveform 218 is used to control a switch (such as the power control switch 312 of FIG. 3) to open and close.

Figure 5A:
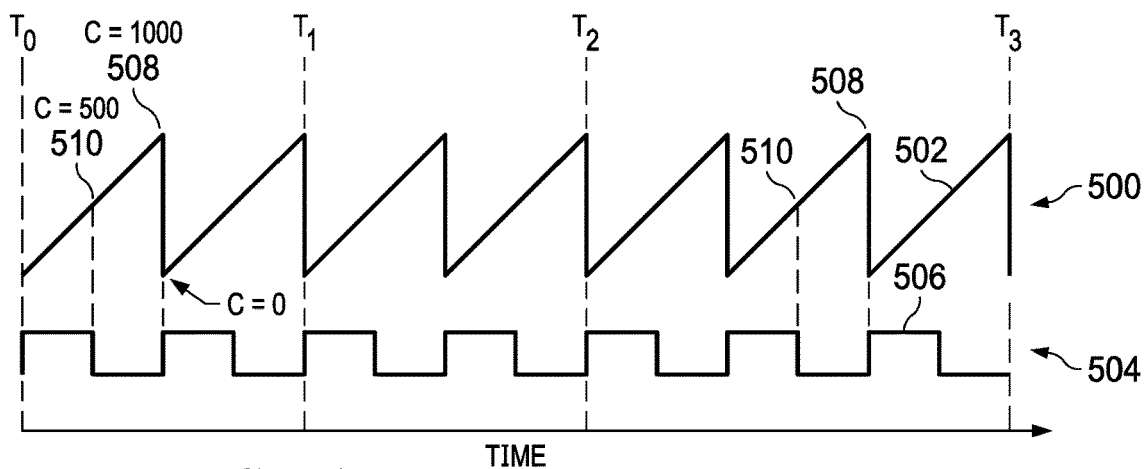
FIG. 5A shows an example of a count plot of a PWM control counter (with fixed period) against time, and an example of a timing diagram of a PWM waveform generated using the control counter.

FIG. 5A shows an example of a count plot 500 of a PWM control counter 502 against time, and an example of a timing diagram 504 of a PWM waveform 506 generated using the PWM control counter 502. The count plot 500 and the timing diagram 504 use the same time axis. As shown in FIG. 5A, the PWM control counter 502 is compared against two thresholds, a rising edge threshold 508 and a falling edge threshold 510, to cause rising and falling edges (respectively) in the PWM waveform 506. The rising edge threshold 508 corresponds to a maximum count of the PWM control counter 502 which corresponds to a desired frequency of the PWM waveform 506, and the falling edge threshold 510 corresponds to one half (½) of the maximum count of the PWM control counter 502 (a 50% duty cycle). The control counter 502 has a frequency $F_1$, corresponding to a maximum count of C=1000 counts.

Figure 5B:
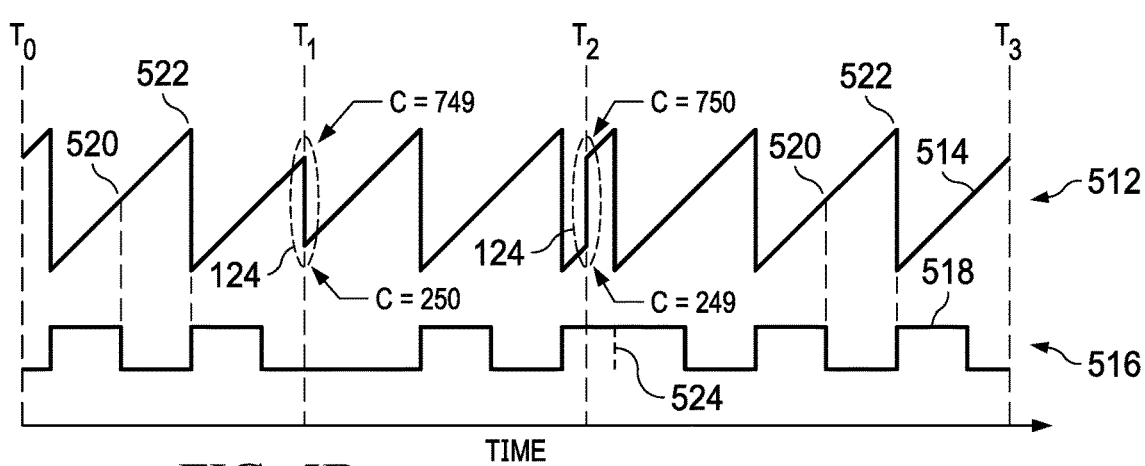
FIG. 5B shows a prior art example of a count plot of a PWM control counter (with fixed period and variable phase shift with respect to the PWM control counter of FIG. 5A) against time, and an example of a timing diagram of a PWM waveform generated using the control counter.

FIG. 5B shows a prior art example of a count plot 512 of a PWM control counter 514 against time, and an example of a timing diagram 516 of a PWM waveform 518 generated using the PWM control counter 514. The count plot 512 and the timing diagram 516 use the same time axis. The PWM control counter 502 of FIG. 5A acts as a master control counter with respect to the PWM control counter 514 of FIG. 5B (see description of master and slave control counters with respect to FIG. 2B; PWM control counter 514 values for count (except during a period which spans or is next subsequent to a change in frequency or phase delay), frequency, and thresholds of FIG. 5B are the same as PWM control counter 502 values for count, frequency, and thresholds of FIG. 5A). The PWM control counter 514 of FIG. 5B is phase shifted +90° (25%) with respect to the PWM control counter 502 of FIG. 5A during times $T_0$ to $T_1$ and $T_2$ to $T_3$, and is phase shifted +270° (75%) during times $T_1$ to $T_2$. This means that at time $T_1$, the count of the PWM control counter 514 changes from being phase shifted +90° (25%) to +270° (75%) with respect to the count at time $T_1$ of the PWM control counter 502 of FIG. 5A. This also means that at time $T_2$, the count of the PWM control counter 514 changes from being phase shifted +270° (75%) to +90° (25%) with respect to the count at time $T_1$ of the control counter 502 of FIG. 5A. The control counter 514 does not use transitional cycles.

When the PWM control counter 514 transitions from phase shift +90° to phase shift +270° (with respect to the PWM control counter 502 of FIG. 5A) at time $T_1$, to maintain the new phase shift, the count changes from a count corresponding to the previous phase shift (C=750) to a count corresponding to the new phase shift (C=250). (A similar change in the count from C=250 to C=750 occurs at the PWM control counter 514 phase shift transition at time $T_2$.) As a result, a falling edge threshold 520 is not reached at time $T_1$ on transition from +90° to +270°, because the control counter 514 count jumps from 749 to 250 at time $T_1$. Accordingly, at time $T_1$, when the PWM control counter 514 would reach the falling edge threshold 520 if there were no phase shift change, the PWM control counter 514 does not increment to the falling edge threshold 520, and no falling edge is triggered in the PWM waveform 518 at time $T_1$. Similarly, at time $T_2$, when the PWM control counter 514 would reach a rising edge threshold 522 if there were no phase shift change, the PWM control counter 514 does not increment to (instead, jumps to) the rising edge threshold 522, and no rising edge is triggered in the PWM waveform 518 at time $T_2$. Consequently, PWM waveform 518 cycles are erroneously extended. For example, the timing diagram 516 shows an error 524 where a rising edge threshold 522 is met, but the PWM waveform 518 is already high because of the discontinuity 124 in the PWM control counter 514—missing the falling edge threshold 520—at time $T_2$.

Figure 5C:
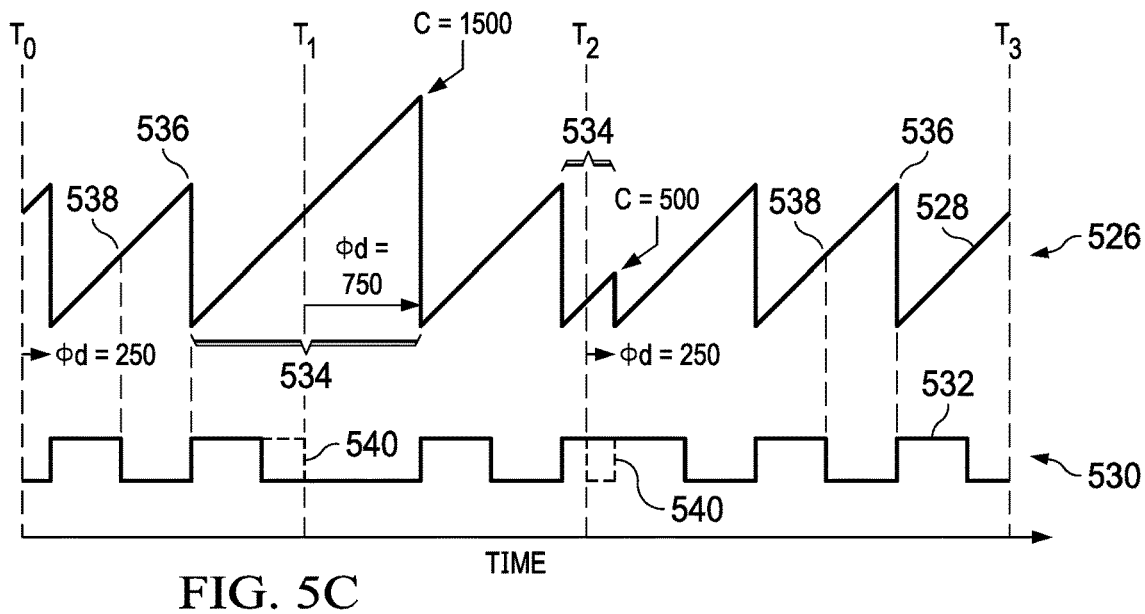
FIG. 5C shows an example of a count plot of a PWM control counter (with fixed period and variable phase shift with respect to the PWM control counter of FIG. 5A) against time, and an example of a timing diagram of a PWM waveform generated using the control counter.

FIG. 5C shows an example of a count plot 526 of a PWM control counter 528 against time, and an example of a timing diagram 530 of a PWM waveform 532 generated using the PWM control counter 528. The count plot 526 and the timing diagram 530 use the same time axis. The PWM control counter 502 of FIG. 5A acts as a master control counter with respect to the PWM control counter 528 of FIG. 5C (see description of master and slave control counters with respect to FIG. 2B; PWM control counter 528 values for count (except during a period which spans or is next subsequent to a change in frequency or phase delay), frequency, and thresholds of FIG. 5C are the same as PWM control counter 502 values for count, frequency, and thresholds of FIG. 5A). The PWM control counter 528 of FIG. 5C is phase shifted +90° (25%) with respect to the PWM control counter 502 of FIG. 5A during times $T_0$ to $T_1$ and $T_2$ to $T_3$, and is phase shifted +270° (75%) during times $T_1$ to $T_2$ (similarly to, and as described with respect to, FIG. 5B). At phase changes ($T_1$ and $T_2$), the PWM control counter 528 of FIG. 5C avoids discontinuities 124 in the count of the PWM control counter 528 by extending the current cycle of the PWM control counter 528 to generate a transitional cycle 534.

Periods of transitional cycles 534 in FIG. 5C are determined as shown in Equation 1. The phase delay count of the PWM waveform 532 of FIG. 5C with respect to the PWM waveform 506 of FIG. 5A between $T_0$ and $T_1$ and between $T_2$ and $T_3$ (when the PWM control counter 528 is phase shifted +90°) is C=250 (0.25×1000) counts. The phase delay count of the PWM waveform 532 of FIG. 5C with respect to the PWM waveform 506 of FIG. 5A between $T_1$ and $T_2$ (when the control counter 528 has phase shift +270° with respect to the (master) PWM control counter 502) is C=750 (0.75×1000) counts. Therefore, the duration $T_{cn}$ of a transitional cycle 534 for switching from phase shift +90° to phase shift +270° at time $T_1$ is 1000−(250−750)=1500 counts; and the duration $T_{cn}$ of a transitional cycle 534 for switching from phase shift +270° to phase shift +90° at time $T_2$ is 1000−(750−250)=500 counts. As shown in FIG. 5C, the resulting transitional cycles 534 avoid discontinuities 124 and properly trigger a rising edge threshold 536 and a falling edge threshold 538. Also, to maintain a 50% duty cycle of the PWM waveform 532, the falling edge threshold 538 of the transitional cycle 534 spanning T$_1$ of duration C=1500 counts can be adjusted to C=750 (0.5×1500) counts; and the falling edge threshold 538 of the transitional cycle 534 spanning T$_2$ of duration C=500 counts can be adjusted to C=250 (0.5×500) counts. The adjusted portion 540 of the PWM waveform 532 is shown using dotted lines.

Figure 6A:
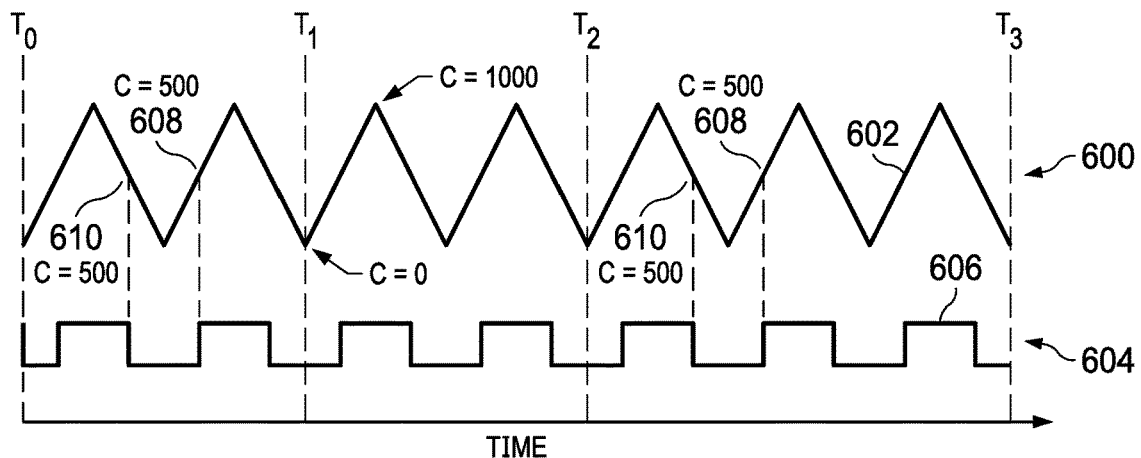
FIG. 6A shows an example of a count plot of a PWM control counter (with fixed period) against time, and an example of a timing diagram of a PWM waveform generated using the control counter.

FIG. 6A shows an example of a count plot 600 of a PWM control counter 602 against time, and an example of a timing diagram 604 of a PWM waveform 606 generated using the PWM control counter 602. The count plot 600 and the timing diagram 604 use the same time axis. The PWM control counter 602 of FIG. 6A counts up to a maximum value (incrementing), and then counts back down to zero (decrementing), resulting in a triangle pattern in the count plot 600. The PWM control counter 602 is compared against two thresholds, a rising edge threshold 608 and a falling edge threshold 610 (in the examples shown in FIGS. 6A through 7C, the rising edge thresholds are the same as the falling edge thresholds), to cause rising and falling edges (respectively) in the PWM waveform 606. The rising edge threshold 608 and the falling edge threshold 610 correspond to a desired frequency of the PWM waveform 606. Both the rising edge threshold 608 and the falling edge threshold 610 equal C=500 counts. The maximum count of the PWM control counter 602 is C=1000 counts, corresponding to a total PWM control counter 602 period of C=2000 counts.

Figure 6B:
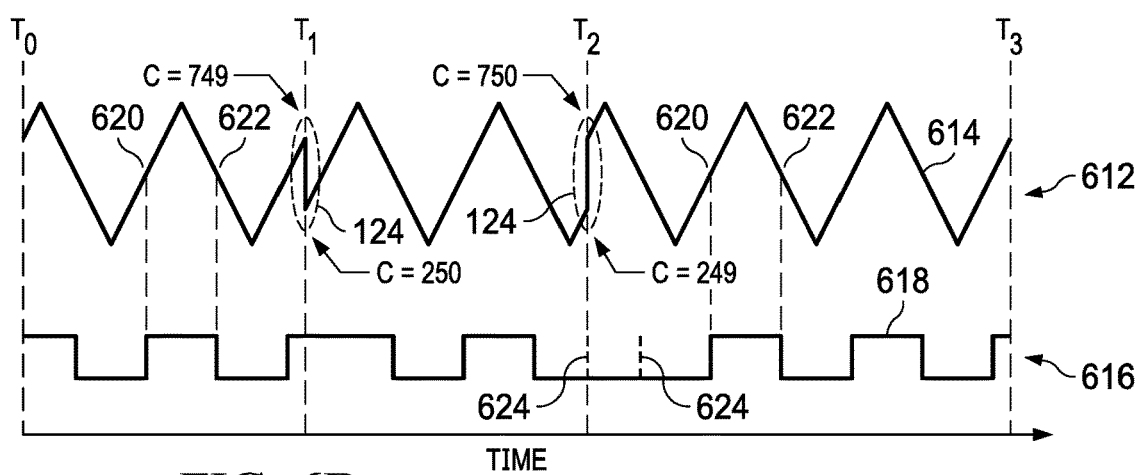
FIG. 6B shows a prior art example of a count plot of a PWM control counter (with fixed period and variable phase shift with respect to the PWM control counter of FIG. 6A) against time, and an example of a timing diagram of a PWM waveform generated using the control counter.

FIG. 6B shows an example of a count plot 612 of a PWM control counter 614 against time, and an example of a timing diagram 616 of a PWM waveform 618 generated using the PWM control counter 614. The count plot 612 and the timing diagram 616 use the same time axis. The PWM control counter 602 of FIG. 6A acts as a master control counter with respect to the (slave) PWM control counter 614 of FIG. 6B (see description of master and slave control counters with respect to FIG. 2B; PWM control counter 614 values for count (except during a period which spans or is next subsequent to a change in frequency or phase delay), frequency, and thresholds of FIG. 6B are the same as PWM control counter 602 values for count, frequency, and thresholds of FIG. 6A). The PWM control counter 614 of FIG. 6B is phase shifted +225° (62.5%) with respect to the PWM control counter 602 of FIG. 6A during times T$_0$ to T$_1$ and T$_2$ to T$_3$, and is phase shifted +315° (87.5%) during times T$_1$ to T$_2$. The PWM control counter 614 does not use transitional cycles.

The PWM control counter 614 shows discontinuities 124 at times T$_1$ (the count jumping from C=749 to C=250) and T$_2$ (the count jumping from C=249 to C=750), which result in the PWM control counter 614 delaying meeting a rising edge threshold 620 after T$_1$, and skipping a rising edge threshold 620 at T$_2$. The skipped rising edge threshold 620 results in a PWM waveform 618 error 624 and the PWM waveform 618 being unaffected by the subsequent falling edge, causing another error 624. This means that the PWM waveform 618 skips an entire cycle as a result of the discontinuity 124 at T$_2$. (There is also a falling edge threshold 622.)

Figure 6C:
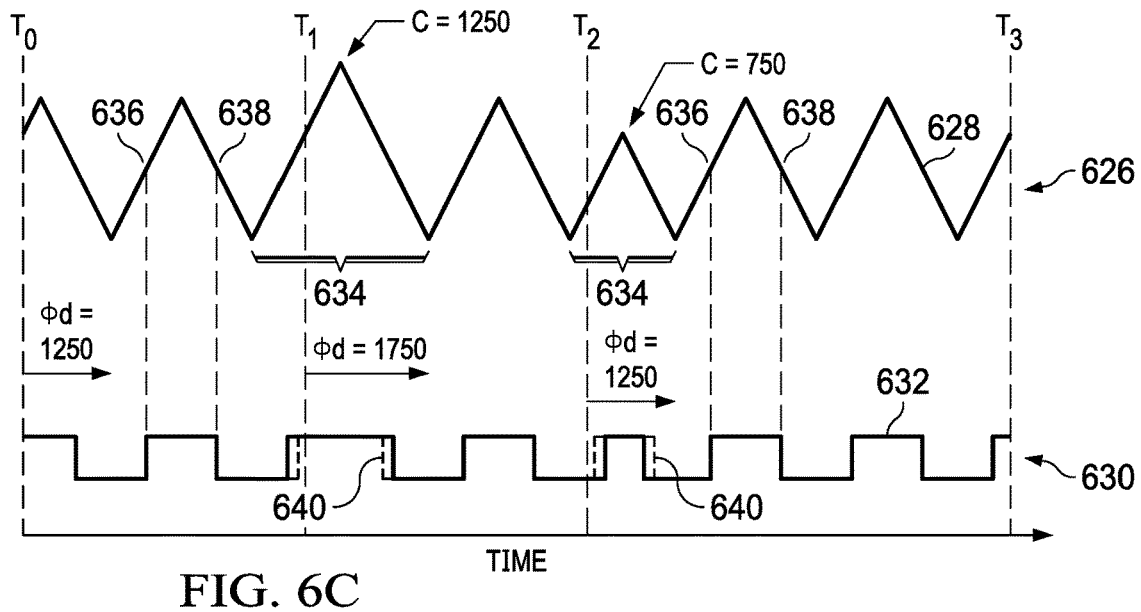
FIG. 6C shows an example of a count plot of a PWM control counter (with fixed period and variable phase shift with respect to the PWM control counter of FIG. 6A) against time, and an example of a timing diagram of a PWM waveform generated using the control counter.

FIG. 6C shows an example of a count plot 626 of a PWM control counter 628 against time, and an example of a timing diagram 630 of a PWM waveform 632 generated using the PWM control counter 628. The count plot 626 and the timing diagram 630 use the same time axis. The PWM control counter 602 of FIG. 6A acts as a master control counter with respect to the (slave) PWM control counter 628 of FIG. 6C (see description of master and slave control counters with respect to FIG. 2B; PWM control counter 628 values for count (except during a period which spans or is next subsequent to a change in frequency or phase delay), frequency, and thresholds of FIG. 6C are the same as PWM control counter 602 values for count, frequency, and thresholds of FIG. 6A). The PWM control counter 628 of FIG. 6C is phase shifted +225° (62.5%) with respect to the PWM control counter 602 of FIG. 6A during times T$_0$ to T$_1$ and T$_2$ to T$_3$, and is phase shifted +315° (87.5%) during times T$_1$ to T$_2$.

The triangle pattern of FIG. 6C uses transitional cycles 634 to avoid the discontinuities shown in FIG. 6B. These transitional cycles 634 are calculated as follows:

$$T_{cn} = T_c - \frac{(\Phi d_c - \Phi d_n)}{2} \qquad \text{Equation 2}$$

Figure 7A:
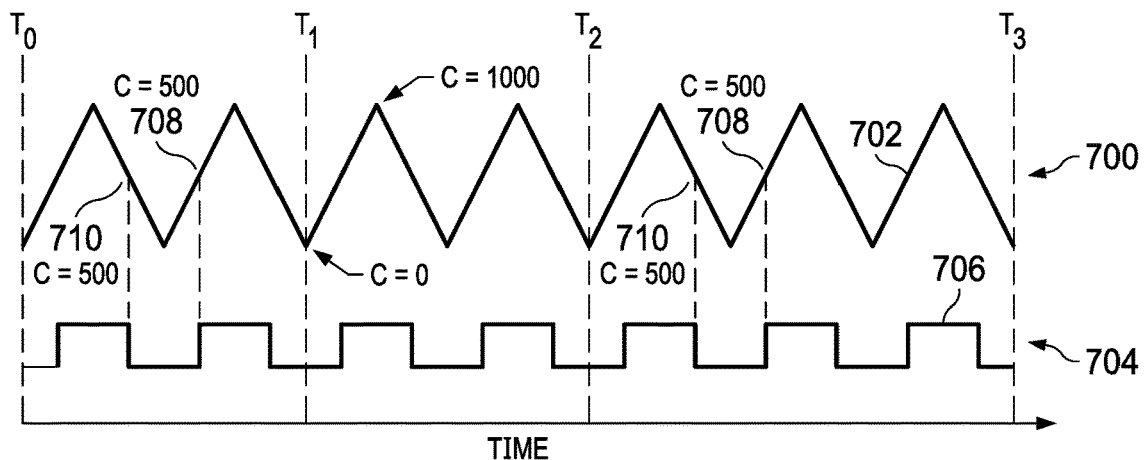
FIG. 7A shows an example of a count plot of a PWM control counter (with fixed period) against time, and an example of a timing diagram of a PWM waveform generated using the control counter.
Figure 7B:
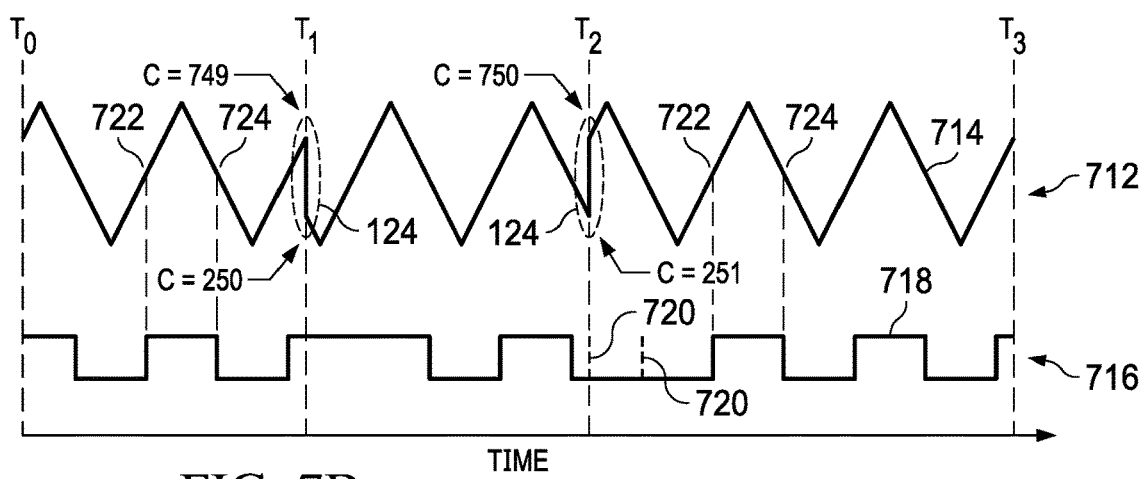
FIG. 7B shows a prior art example of a count plot of a PWM control counter (with fixed period and variable phase shift with respect to the PWM control counter of FIG. 7A) against time, and an example of a timing diagram of a PWM waveform generated using the control counter.
Figure 7C:
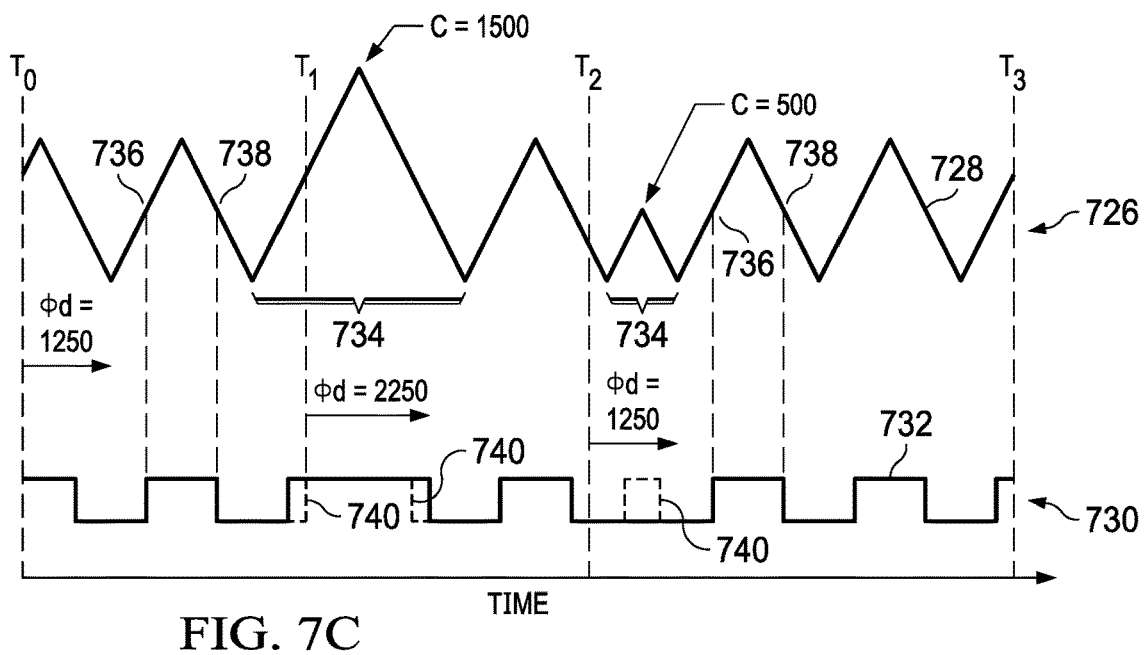
FIG. 7C shows an example of a count plot of a PWM control counter (with fixed period and variable phase shift with respect to the PWM control counter of FIG. 7A) against time, and an example of a timing diagram of a PWM waveform generated using the control counter.

For the triangle patterns of FIGS. 6C and 7C, T$_{cn}$ represents the maximum value minus the minimum value of the PWM control counter 628 prior to the frequency or phase shift change spanned by the transitional cycle 634. The maximum value minus the minimum value of the PWM control counter 628 equals half of the period of the (triangle pattern) PWM control counter 628. The phase delay count of the PWM waveform 632 of FIG. 6C with respect to the PWM waveform 606 of FIG. 6A between T$_0$ and T$_1$ and between T$_2$ and T$_3$ (when the PWM control counter 628 is phase shifted +225°) is C=1250 (0.625×2000) counts. The phase delay count of the PWM waveform 632 of FIG. 6C with respect to the PWM waveform 606 of FIG. 6A between T$_1$ and T$_2$ (when the control counter 628 has phase shift +315° with respect to the (master) PWM control counter 602) is C=1750 (0.875×2000) counts. Therefore, the maximum value T$_{cn}$ of a transitional cycle 634 for switching from phase shift +225° to phase shift +315° at time T$_1$ is $$1000 - \frac{(250 - 750)}{2} = 1250 \text{ (the duration is } 2*T_{cn} = 2500\text{) counts;}$$

and the maximum value T$_{cn}$ of a transitional cycle 634 for switching from phase shift +315° to phase shift +225° at time T$_2$ is $$1000 - \frac{(750 - 250)}{2} = 750 \text{ (the duration is } 2*T_{cn} = 1500\text{) counts.}$$

The resulting transitional cycles 634 avoid discontinuities 124 and properly trigger a rising edge threshold 636 and a falling edge threshold 638. Also, to maintain a 50% duty cycle of the PWM waveform 632, the rising and falling edge thresholds 636, 638 of the transitional cycle 634 spanning T$_1$ of maximum value C=1250 counts can be adjusted to C=625 (0.5×1250) counts; and the rising and falling edge thresholds 636, 638 of the transitional cycle 634 spanning T$_2$ of maximum value C=750 counts can be adjusted to C=325 (0.5×750) counts. Accordingly, to maintain the duty cycle of the PWM waveform generated using a sawtooth pattern control counter, the rising and falling edge thresholds of a transitional cycle can be set to the maximum value Tcn of the transitional cycle multiplied by the duty cycle. The adjusted portion 640 of the PWM waveform 632 is shown using dotted lines.

FIG. 7A shows an example of a count plot 700 of a PWM control counter 702 against time, and an example of a timing diagram 704 of a PWM waveform 706 generated using the PWM control counter 702. The count plot 700 and the timing diagram 704 use the same time axis. The PWM control counter 702 of FIG. 7A counts up to a maximum value, and then counts back down to zero, resulting in a triangle pattern in the count plot 700. Both the rising edge threshold 708 and the falling edge threshold 710 equal C=500 counts. The maximum count of the PWM control counter 702 is C=1000 counts, corresponding to a total PWM control counter 702 period of C=2000 counts.

FIG. 7B shows a prior art example of a count plot 712 of a PWM control counter 714 against time, and an example of a timing diagram 716 of a PWM waveform 718 generated using the PWM control counter 714. The count plot 712 and the timing diagram 716 use the same time axis. The PWM control counter 702 of FIG. 7A acts as a master control counter with respect to the (slave) PWM control counter 714 of FIG. 7B (see description of master and slave control counters with respect to FIG. 2B; PWM control counter 714 values for count (except during a period which spans or is next subsequent to a change in frequency or phase delay), frequency, and thresholds of FIG. 7B are the same as PWM control counter 702 values for count, frequency, and thresholds of FIG. 7A). The PWM control counter 714 of FIG. 7B is phase shifted +225° (62.5%) with respect to the PWM control counter 702 of FIG. 7A during times $T_0$ to $T_1$ and $T_2$ to $T_3$, and is phase shifted +45° (12.5%) during times $T_1$ to $T_2$. The PWM control counter 714 does not use transitional cycles.

The PWM control counter 714 shows discontinuities 124 at times $T_1$, the count jumping from C=749 while incrementing to C=250 while decrementing, and $T_2$, the count jumping from C=251 while decrementing to C=750 while incrementing. This results in PWM half-cycles (a high PWM signal spanning $T_1$, and a low PWM signal spanning $T_2$) which last for full PWM control counter 714 periods. The errors 720 shown in the timing diagram 716 correspond to skipped rising edge thresholds 722 and skipped falling edge thresholds 724.

FIG. 7C shows an example of a count plot 726 of a PWM control counter 728 against time, and an example of a timing diagram 730 of a PWM waveform 732 generated using the PWM control counter 728. The count plot 726 and the timing diagram 730 use the same time axis. The PWM control counter 702 of FIG. 7A acts as a master control counter with respect to the (slave) PWM control counter 728 of FIG. 7C (see description of master and slave control counters with respect to FIG. 2B; PWM control counter 728 values for count (except during a period which spans or is next subsequent to a change in frequency or phase delay), frequency, and thresholds of FIG. 7C are the same as PWM control counter 702 values for count, frequency, and thresholds of FIG. 7A). The PWM control counter 728 of FIG. 7C is phase shifted +225° (62.5%) with respect to the PWM control counter 702 of FIG. 7A during times $T_0$ to $T_1$ and $T_2$ to $T_3$, and is phase shifted +45° (12.5%) during times $T_1$ to $T_2$.

As shown in FIG. 7C, when a phase delay count would otherwise be less than the maximum count value of a triangle pattern control counter (a control counter which increments from zero to a maximum value and decrements from the maximum value to zero), twice the maximum value is added to the phase delay count for purposes of calculations herein. The phase delay count of the PWM waveform 732 of FIG. 7C with respect to the PWM waveform 706 of FIG. 7A between $T_0$ and $T_1$ and between $T_2$ and $T_3$ (when the PWM control counter 728 is phase shifted +225°) is C=1250 (0.625×2000) counts. The phase delay count of the PWM waveform 732 of FIG. 7C with respect to the PWM waveform 706 of FIG. 7A between $T_1$ and $T_2$ (when the control counter 728 has phase shift +45° with respect to the master control counter 702) is C=2250 (0.125×2000+2000) counts. (The phase delay count between $T_1$ and $T_2$ is 250, which is less than the maximum count C=1000; therefore, for purposes of calculation, the phase delay count between $T_1$ and $T_2$ is treated as C=250+1000*2=2250.) Therefore, the maximum value $T_{cn}$ of a transitional cycle 734 for switching from phase shift +225° to phase shift +45° at time $T_1$ is $$1000 - \frac{(1250 - 2250)}{2} = 1500 \text{ (the duration is } 2*T_{cn} = 3000\text{) counts;}$$

and the maximum value $T_{cn}$ of a transitional cycle 734 for switching from phase shift +45° to phase shift +225° at time $T_2$ is $$1000 - \frac{(2250 - 1250)}{2} = 500 \text{ (the duration is } 2*T_{cn} = 1500\text{) counts.}$$

However, because the transitional cycle 734 does not change the period of the cycle spanning time $T_2$, the count of which is decreasing when the phase delay count changes at time $T_2$, the transitional cycle is the next subsequent cycle after time $T_2$ (for an nth cycle, the next subsequent cycle is the (n+1)th cycle)—accordingly, the cycle following the frequency change or phase delay count change. The resulting transitional cycles 734 avoid discontinuities 124 and properly trigger a rising edge threshold 736 and a falling edge threshold 738. Also, to maintain a 50% duty cycle of the PWM waveform 732, the rising and falling edge thresholds 736, 738 of the transitional cycle 734 spanning $T_1$ of maximum value C=1500 counts can be adjusted to C=750 (0.5×1500) counts; and the rising and falling edge thresholds 736, 738 of the transitional cycle 734 following $T_2$ of maximum value C=500 can be adjusted to C=250 (0.5×500) counts. The adjusted portion 740 of the PWM waveform 732 is shown using dotted lines.

Figure 8A:
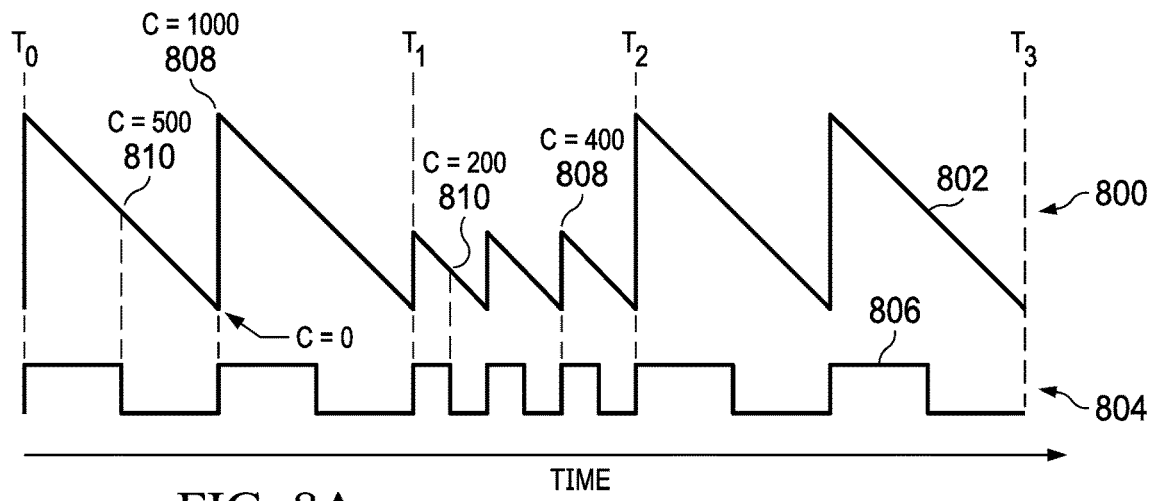
FIG. 8A shows an example of a count plot of a PWM control counter (with variable period) against time, and an example of a timing diagram of a PWM waveform generated using the control counter.

FIG. 8A shows an example of a count plot 800 of a PWM control counter 802 against time, and an example of a timing diagram 804 of a PWM waveform 806 generated using the PWM control counter 802. The count plot 800 and the timing diagram 804 use the same time axis. The PWM control counter 802 of FIG. 8A counts down from a maximum value to zero, resulting in a reverse sawtooth pattern in the count plot 800. A first desired frequency $F_1$, designated for a time $T_0$ to a time $T_1$, corresponds to a maximum count of C=1000 counts; a second desired frequency $F_2$, designated for a time $T_1$ to a time $T_2$, corresponds to a maximum count of C=400 counts; and a third desired frequency $F_3$, designated for a time $T_2$ to a time $T_3$, corresponds to a maximum count of C=1000 (that is, for this example, $F_1=F_3$) counts. The rising edge threshold 808 for frequencies $F_1$ and $F_3$ is C=1000 counts, and the falling edge threshold 810 for frequencies $F_1$ and $F_3$ equals C=500 counts. The rising edge threshold 808 for frequency $F_2$ is C=400 counts, and the falling edge threshold for frequency $F_2$ is C=200 counts.

Figure 8B:
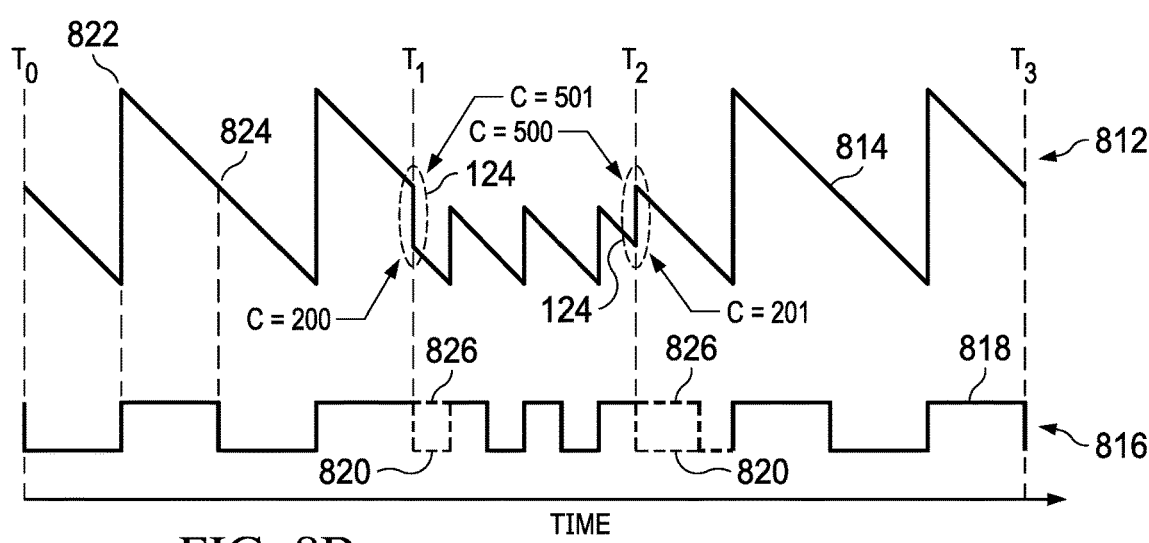
FIG. 8B shows a prior art example of a count plot of a PWM control counter (with variable period and a fixed +180° phase shift with respect to the PWM control counter of FIG. 8A) against time, and an example of a timing diagram of a PWM waveform generated using the control counter.

FIG. 8B shows a prior art example of a count plot 812 of a PWM control counter 814 against time, and an example of a timing diagram 816 of a PWM waveform 818 generated using the PWM control counter 814. The count plot 812 and the timing diagram 816 use the same time axis. The PWM control counter 802 of FIG. 8A acts as a master control counter with respect to the (slave) PWM control counter 814 of FIG. 8B (see description of master and slave control counters with respect to FIG. 2B; PWM control counter 814 values for count (except during a period which spans or is next subsequent to a change in frequency or phase delay), frequencies, and thresholds of FIG. 8B are the same as PWM control counter 802 values for count, frequencies, and thresholds of FIG. 8A). The PWM control counter 814 of FIG. 8B is phase shifted +180° (50%) with respect to the PWM control counter 802 of FIG. 8A. The PWM control counter 814 of FIG. 8B does not use transitional cycles.

The PWM control counter 814 shows discontinuities 124 at time $T_1$, the count jumping from C=501 to C=200, and at time $T_2$, the count jumping from C=201 to C=500. The former period does not trigger the corresponding threshold because the count does not properly decrement to the threshold value, and the latter period does not trigger the corresponding threshold until the old threshold (which does not change until the period ends) is reached later in the period. This results in PWM half-cycles (a high PWM signal spanning $T_1$, and a high PWM signal spanning $T_2$) which last for full or nearly full PWM control counter 814 periods. The errors 820 shown in the timing diagram 816 correspond to skipped rising edge thresholds 822 and/or skipped falling edge thresholds 824, and result in erroneous portions 826 of the PWM waveform 818.

Figure 8C:
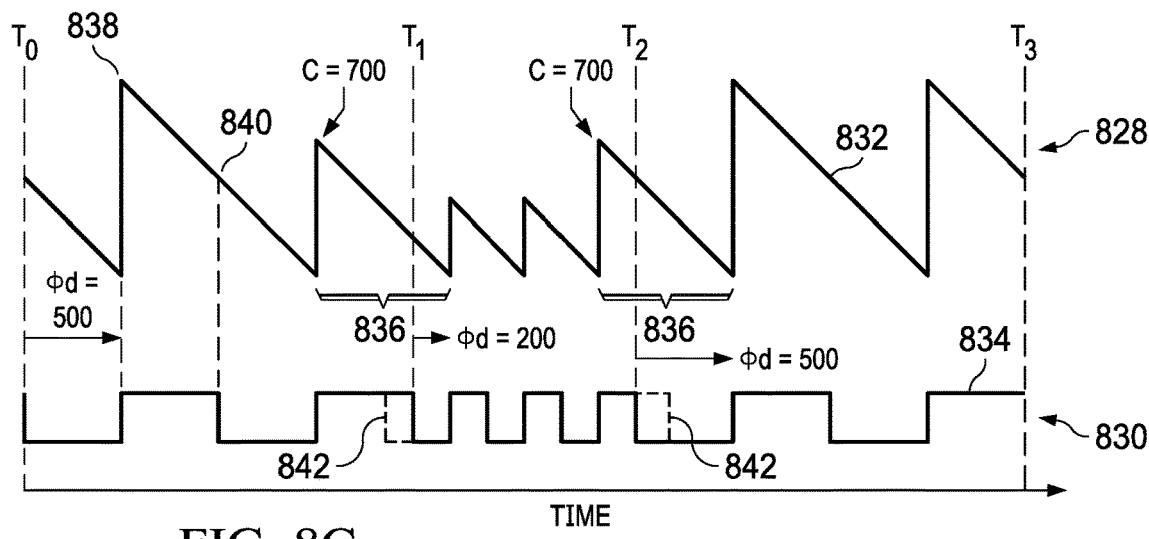
FIG. 8C shows an example of a count plot of a PWM control counter (with variable period and a fixed +180° phase shift with respect to the PWM control counter of FIG. 8A) against time, and an example of a timing diagram of a PWM waveform generated using the control counter.

FIG. 8C shows an example of a count plot 828 of a PWM control counter 830 against time, and an example of a timing diagram 832 of a PWM waveform 834 generated using the PWM control counter 830. The count plot 828 and the timing diagram 832 use the same time axis. The PWM control counter 802 of FIG. 8A acts as a master control counter with respect to the (slave) PWM control counter 830 of FIG. 8C (see description of master and slave control counters with respect to FIG. 2B; PWM control counter 830 values for count (except during a period which spans or is next subsequent to a change in frequency or phase delay), frequencies, and thresholds of FIG. 8C are the same as PWM control counter 802 values for count, frequencies, and thresholds of FIG. 8A). The PWM control counter 830 of FIG. 8C is phase shifted +180° (50%) with respect to the PWM control counter 802 of FIG. 8A. At phase changes ($T_1$ and $T_2$), the PWM control counter 830 of FIG. 8C avoids discontinuities 124 in the count of the PWM control counter 830 by extending the current cycle of the PWM control counter 830 to generate a transitional cycle 836.

Periods of transitional cycles 836 in FIG. 8C are determined as shown in Equation 1. The phase delay count of the PWM waveform 834 of FIG. 8C with respect to the PWM waveform 806 of FIG. 8A between $T_0$ and $T_1$ and between $T_2$ and $T_3$ (when the maximum count of the PWM control counter 830 is C=1000 counts) is C=500 (0.5×1000) counts. The phase delay count of the PWM waveform 834 of FIG. 8C with respect to the PWM waveform 806 of FIG. 8A between $T_1$ and $T_2$ (when the maximum count of the control counter 830 is C=400 counts) is C=200 (0.5×400) counts. Therefore, the duration $T_{cn}$ of a transitional cycle 836 for switching at time $T_1$ from maximum count C=1000 to maximum count C=400 with phase shift of +180°, is 1000−(500−200)=700 counts; and the duration $T_{cn}$ of a transitional cycle 836 for switching at time $T_2$ from maximum count C=400 to maximum count C=1000 with phase shift of +180°, is 400−(200−500)=700 counts. As shown in FIG. 8C, the resulting transitional cycles 836 avoid discontinuities 124 and properly trigger a rising edge threshold 838 and a falling edge threshold 840. Also, to maintain a 50% duty cycle of the PWM waveform 834, the falling edge threshold 840 of the transitional cycle 836 spanning $T_1$ of duration C=700 counts can be adjusted to C=350 (0.5×700) counts; and the falling edge threshold 840 of the transitional cycle 836 spanning $T_2$ of duration C=700 counts can be adjusted to C=350 (0.5×700) counts. The adjusted portion 842 of the PWM waveform 834 is shown using dotted lines.

Modifications are possible in the described embodiments, and other embodiments are possible, within the scope of the claims.

In some embodiments, threshold values change at times other than when a frequency change or a phase shift change occurs.

In some embodiments using a triangle pattern, a rising edge threshold and a falling edge threshold for a period are different.

In some embodiments, a PWM waveform is used to control a device responsive to duty cycle-based and oscillation-based control, such as controlling a switch which controls delivery of power to a power stage.

In some embodiments, a falling edge threshold can be located at a maximum count value of a sawtooth pattern or reverse sawtooth pattern count controller.

In embodiments described herein, particular duty cycles are referred to. In some embodiments, different duty cycles can be used.

In some embodiments, power can be delivered to a load when a switch is open, and prevented from being delivered to the load when the switch is closed.

Embodiments shown herein use square-wave PWM waveforms. In some embodiments, other periodic signals that enable a phase relationship to be maintained between (or among) them can be used to constitute PWM waveforms corresponding to master and slave control counters.

The minimum count value of master control counters and slave control counters is treated herein as zero for purposes of calculations described above, though, in some embodiments, other minimum count values can be used. For example, negative count values or count values greater than zero can be used. In embodiments where the minimum count value is other than zero, the count can be made equivalent to a count with a zero minimum value by subtracting the non-zero minimum count value from the count and by subtracting the non-zero minimum count value from the maximum count value.

Embodiments which increment and decrement master control counters and/or slave control counters by other than one (such as by fractions or by integers greater than one) are generally equivalent to—accordingly, their counts are proportional to—control counters which increment and decrement by one. Accordingly, control counters which increment and decrement by other than one are considered to be correspondingly rescaled to incrementing and decrementing by one for purposes of all calculations described herein.

What is claimed is:

1. A method comprising:
   during a first period of time:
   outputting, by a first counter, a first output signal, based on counting, by the first counter, a first number of counts, the first counter having a first maximum value during the first period of time; and
   outputting, by a second counter, a second output signal, based on counting, by the second counter, a second number of counts, the second counter having the first maximum value during the first period of time, the second counter having a first phase delay relative to the first counter during the first period of time;

during a second period of time:

outputting, by the first counter, a third output signal, based on counting, by the first counter, a third number of counts, the first counter having a second maximum value during the second period of time; and outputting, by the second counter, a fourth output signal, based on counting, by the second counter, a fourth number of counts, the second counter having the second maximum value during the second period of time, the second counter having a second phase delay relative to the first counter during the second period of time; and during a transitional period of time between the first period of time and the second period of time, outputting, by the second counter, a fifth output signal, based on counting, by the second counter, a fifth number of counts, the second counter having a third maximum value during the transitional period of time, the third maximum value different than the first maximum value and the second maximum value, the second counter completing at least one period during the transitional period of time.

2. The method of claim 1, wherein counting, by the first counter, during the first period of time comprises incrementing the first counter from a minimum value to the first maximum value.

3. The method of claim 1, wherein counting, by the first counter, during the first period of time comprises decrementing the first counter from the first maximum value to a minimum value.

4. The method of claim 1, where counting, by the first counter, during the first period of time comprises incrementing the first counter from a minimum value to the first maximum value and decrementing the first counter from the first maximum value to the minimum value.

5. The method of claim 1, wherein a period of the second counter during the transitional period of time ($T_{cn}$) is set to:

$$T_{cn} = T_c - (\Phi d_c - \Phi d_n),$$

wherein $T_c$ is a period of the first counter during the first period of time, $\Phi d_c$ is the first phase delay, and $\Phi d_n$ is the second phase delay.

6. The method of claim 1, wherein a period of the second counter during the transitional period of time ($T_{cn}$) is set to:

$$T_{cn} = T_c - \frac{(\Phi d_c - \Phi d_n)}{2},$$

wherein $T_c$ is a period of the first counter during the first period of time, $\Phi d_c$ is the first phase delay, and $\Phi d_n$ is the second phase delay.

7. The method of claim 1, wherein the third maximum value is between the first maximum value and the second maximum value.

8. The method of claim 1, wherein the third maximum value is greater than the first maximum value and the second maximum value.

9. The method of claim 1, wherein the third maximum value is less than the first maximum value and the second maximum value.

10. Circuitry comprising:

a first counter configured to:

during a first period of time, output a first output signal, based on counting a first number of counts, the first counter having a first maximum value during the first period of time; and during a second period of time, output a second output signal, based on counting a second number of counts, the first counter having a second maximum value during the second period of time; and a second counter coupled to the first counter, the second counter configured to:

during the first period of time, output a third output signal, based on counting a third number of counts, the second counter having the first maximum value, the second counter having a first phase delay relative to the first counter during the first period of time;

during the second period of time, output a fourth output signal, based on counting a fourth number of counts, the second counter having the second maximum value during the second period of time, the second counter having a second phase delay relative to the first counter during the second period of time; and during a transitional period of time between the first period of time and the second period of time, output a fifth output signal, based on counting a fifth number of counts, the second counter having a third maximum value during the transitional period of time, the third maximum value different than the first maximum value and the second maximum value, the second counter completing at least one period during the transitional period of time.

11. The circuitry of claim 10, wherein counting the first counter during the first period of time comprises incrementing the first counter from a minimum value to the first maximum value.

12. The circuitry of claim 10, wherein counting the first counter during the first period of time comprises decrementing the first counter from the first maximum value to a minimum value.

13. The circuitry of claim 10, where counting the first counter during the first period of time comprises incrementing the first counter from a minimum value to the first maximum value and decrementing the first counter from the first maximum value to the minimum value.

14. The circuitry of claim 10, wherein a period of the second counter during the transitional period of time ($T_{cn}$) is set to:

$$T_{cn} = T_c - (\Phi d_c - \Phi d_n),$$

wherein $T_c$ is a period of the first counter during the first period of time, $\Phi d_c$ is the first phase delay, and $\Phi d_n$ is the second phase delay.

15. The circuitry of claim 10, wherein a period of the second counter during the transitional period of time ($T_{cn}$) is set to:

$$T_{cn} = T_c - \frac{(\Phi d_c - \Phi d_n)}{2},$$

wherein $T_c$ is a period of the first counter during the first period of time, $\Phi d_c$ is the first phase delay, and $\Phi d_n$ is the second phase delay.

16. The circuitry of claim 10, wherein the third maximum value is between the first maximum value and the second maximum value.

17. The circuitry of claim 10, wherein the third maximum value is greater than the first maximum value and the second maximum value.

18. The circuitry of claim 10, wherein the third maximum value is less than the first maximum value and the second maximum value.

19. A device, comprising:
- a first counter configured to:
  - during a first period of time, output a first output signal, based on counting a first number of counts, the first counter having a first maximum value during the first period of time; and
  - during a second period of time, output a second output signal, based on counting a second number of counts, the first counter having a second maximum value during the second period of time; and
- a second counter coupled to the first counter, the second counter configured to:
  - during the first period of time, output a third output signal, based on counting a second number of counts, the second counter having the first maximum value, the second counter having a first phase delay relative to the first counter during the first period of time;
  - during the second period of time, output a fourth output signal, based on counting a fourth number of counts, the second counter having the second maximum value during the second period of time, the second counter having a second phase delay relative to the first counter during the second period of time; and
  - during a transitional period of time between the first period of time and the second period of time, output a fifth output signal, based on counting a fifth number of counts, the second counter having a third maximum value during the transitional period of time, the third maximum value different than the first maximum value and the second maximum value, the second counter completing at least one period during the transitional period of time; and
- a pulse width modulation (PWM) signal generator coupled to the second counter, the PWM signal generator configured to generate a PWM waveform based on the third output signal, the fourth output signal, and the fifth output signal.

20. The device of claim 19, further comprising a power control switch coupled to the PWM signal generator, the power control switch configured to operate based on the PWM waveform.

* * * * *